United States Patent
Brauer et al.

(10) Patent No.: US 12,056,867 B2
(45) Date of Patent: Aug. 6, 2024

(54) IMAGE CONTRAST METRICS FOR DERIVING AND IMPROVING IMAGING CONDITIONS

(71) Applicant: KLA Corporation, Milpitas, CA (US)

(72) Inventors: Bjorn Brauer, Beaverton, OR (US);
Sangbong Park, Danville, CA (US);
Hucheng Lee, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 408 days.

(21) Appl. No.: 17/465,810

(22) Filed: Sep. 2, 2021

(65) Prior Publication Data
US 2022/0405903 A1  Dec. 22, 2022

Related U.S. Application Data

(60) Provisional application No. 63/211,556, filed on Jun. 17, 2021.

(51) Int. Cl.
| | |
|---|---|
| *G06T 7/00* | (2017.01) |
| *G06T 7/33* | (2017.01) |
| *G06T 7/80* | (2017.01) |
| *G06V 10/24* | (2022.01) |
| *G06V 10/75* | (2022.01) |

(52) U.S. Cl.
CPC .............. *G06T 7/001* (2013.01); *G06T 7/337* (2017.01); *G06T 7/80* (2017.01); *G06V 10/24* (2022.01); *G06V 10/751* (2022.01); *G06T 2207/10148* (2013.01); *G06T 2207/30148* (2013.01); *G06V 2201/06* (2022.01)

(58) Field of Classification Search
None
See application file for complete search history.

(56) References Cited

U.S. PATENT DOCUMENTS

| | | | |
|---|---|---|---|
| 6,399,953 B1 * | 6/2002 | Kitamura | H01J 37/28 250/492.2 |
| 7,142,294 B2 * | 11/2006 | Shibata | G01N 21/9501 356/237.4 |
| 2003/0219655 A1 | 11/2003 | Sutani et al. | |
| 2006/0262297 A1 * | 11/2006 | Matsui | G01N 21/8806 356/237.5 |
| 2011/0268348 A1 | 11/2011 | Vaughnn | |
| 2012/0176493 A1 | 7/2012 | Hirose et al. | |
| 2014/0071457 A1 | 3/2014 | Cai et al. | |

(Continued)

FOREIGN PATENT DOCUMENTS

| | | | |
|---|---|---|---|
| JP | 5531405 B2 * | 6/2014 | |
| WO | WO-2022207222 A1 * | 10/2022 | |

OTHER PUBLICATIONS

STIC Provided English translation of JP-5531405-B2 (Year: 2014).*
WIPO, International Search Report and Written Opinion for International Application No. PCT/US2022/033506, Sep. 30, 2022.

*Primary Examiner* — Tyler W. Sullivan
(74) *Attorney, Agent, or Firm* — Hodgson Russ LLP

(57) ABSTRACT

Wafer-to-wafer and within-wafer image contrast variations can be identified and mitigated by extracting an image frame during recipe setup and then during runtime at the same location. Image contrast is determined for the two image frames. A ratio of the contrast for the two image frames can be used to determine contrast variations and focus variation.

15 Claims, 5 Drawing Sheets

(56) References Cited

U.S. PATENT DOCUMENTS

2014/0168417 A1* 6/2014 Hsieh ................. G01N 21/8806
                                                                     348/125
2016/0307726 A1* 10/2016 Hatakeyama ......... H01J 37/265
2020/0041760 A1    2/2020 Olson et al.

* cited by examiner

IMAGE CONTRAST METRICS FOR DERIVING AND IMPROVING IMAGING CONDITIONS

CROSS-REFERENCE TO RELATED APPLICATIONS

This application claims priority to the provisional patent application filed Jun. 17, 2021 and assigned U.S. App. No. 63/211,556, the disclosure of which is hereby incorporated by reference.

FIELD OF THE DISCLOSURE

This disclosure relates to imaging of semiconductor wafers.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Inspection systems do not effectively check the focus directly on a die of a semiconductor wafer. Autofocus systems are not sensitive enough to detect image focus changes. Run-time focus calibration systems likewise are not sensitive enough. Furthermore, these previous techniques do not compare image contrast to a golden die. Manual calibration is time-consuming, and may be limited in duration or application to not negatively affect throughput of a semiconductor manufacturer.

Improved techniques and systems are needed.

BRIEF SUMMARY OF THE DISCLOSURE

A method is provided in a first embodiment. The method includes extracting, using a processor, a setup image frame during a recipe setup. A first image contrast for the setup image frame is determined using the processor. A runtime setup image frame is extracted using the processor during runtime at a same location as the setup image frame. The setup image frame and the runtime image frame are aligned using the processor. A second image contrast for the runtime image frame is determined using the processor. A ratio between the first image contrast and the second image contrast is determined using the processor.

The method can include adjusting a position of a stage configured to hold a semiconductor wafer based on the ratio.

The method can include normalizing the ratio by dividing the first image contrast by a maximum contrast for the setup image frame and dividing the second image contrast by a maximum contrast in the runtime image frame using the processor.

The method can include determining, using the processor, focus variations caused by a position of a stage configured to hold a semiconductor wafer using the contrast ratio.

The method can include adjusting, using the processor, the runtime image frame and the setup image frame based on the contrast ratio.

In an instance, the method includes determining, using the processor, a first offset between setup and runtime for a plurality of inspection frames; determining, using the processor, a second offset between design and runtime for the plurality of inspection frames; and determining, using the processor, a placement of one or more care areas based on an offset correction that includes the first offset and the second offset.

The method can include determining, using the processor, offsets using a sum of a squared difference of the setup image frame and runtime image frame.

A non-transitory computer readable medium storing a program can be configured to instruct a processor to execute the method of the first embodiment.

A system is provided in a second embodiment. The system includes a stage configured to hold a semiconductor wafer; an energy source configured to direct a beam at the semiconductor wafer on the stage; a detector configured to receive the beam reflected from the semiconductor wafer on the stage; and a processor in electronic communication with the detector. The energy source can be a light source. The beam can be a beam of light. The processor is configured to: extract a setup image frame during a recipe setup; determine a first image contrast for the setup image frame; extract a runtime setup image frame during runtime at a same location as the setup image frame; align the setup image frame and the runtime image frame; determine a second image contrast for the runtime image frame; and determine a ratio between the first image contrast and the second image contrast.

The processor can be further configured to adjust a position of the stage based on the ratio.

The processor can be further configured to normalize the ratio by dividing the first image contrast by a maximum contrast for the setup image frame and dividing the second image contrast by a maximum contrast in the runtime image frame.

The processor can be further configured to determine focus variations caused by a position of the stage using the contrast ratio.

The processor can be further configured to adjust the runtime image frame and the setup image frame based on the contrast ratio.

In an instance, the processor is further configured to: determine a first offset between setup and runtime for a plurality of inspection frames; determine a second offset between design and runtime for the plurality of inspection frames; and determine a placement of one or more care areas based on an offset correction that includes the first offset and the second offset.

The processor can be further configured to determine offsets using a sum of a squared difference of the setup image frame and runtime image frame.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can identify and mitigate wafer-to-wafer and within-wafer image contrast variations. Image frames can be extracted and image contrast can be determined for the image frames. Focus conditions can be checked with high temporal resolution during runtime. Focus conditions also can be checked for an inspection system directly on inspection images in actively-investigated regions of a die. Out-of-focus conditions, inspection system focus variation, and correct stage position (e.g., in the Z direction) can be determined.

Figure 1:
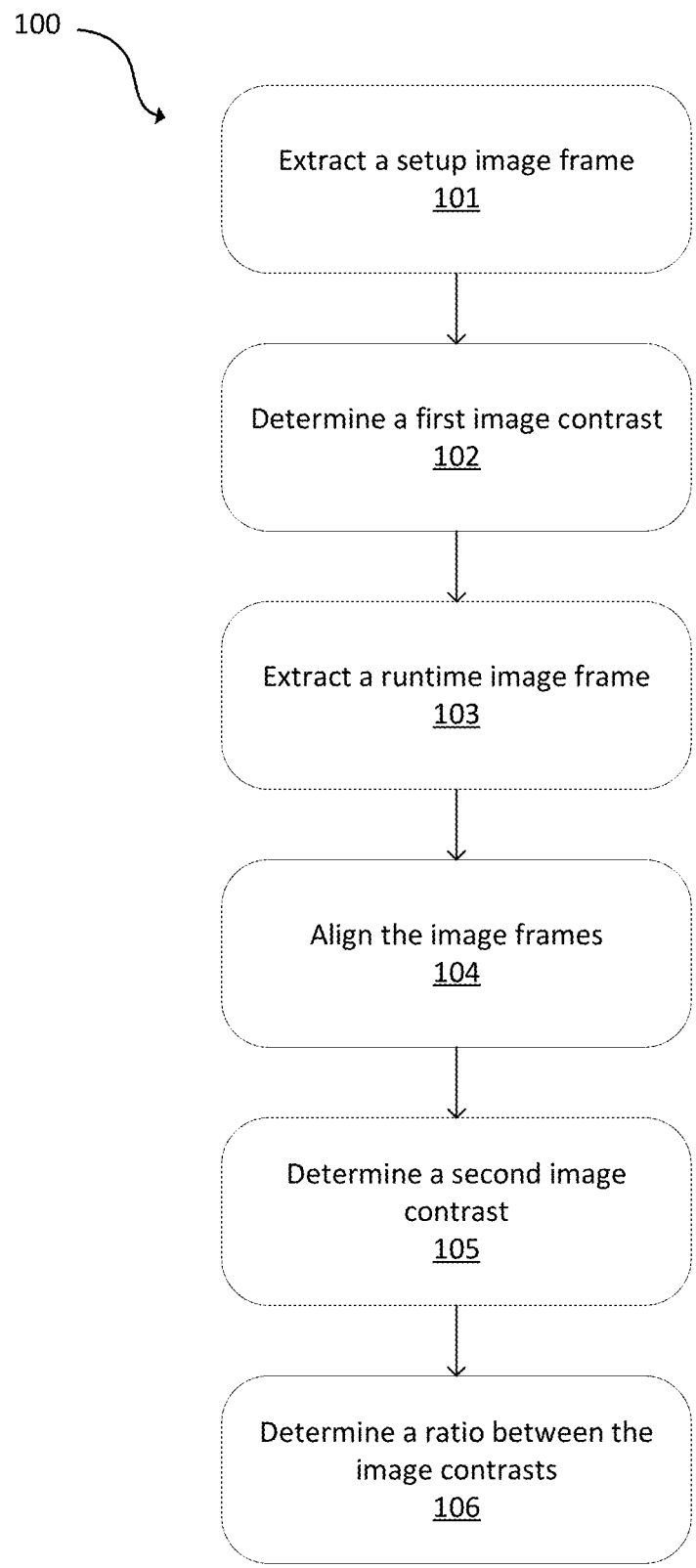
FIG. 1 is a flowchart of an embodiment of a method in accordance with the present disclosure.
Figure 2:
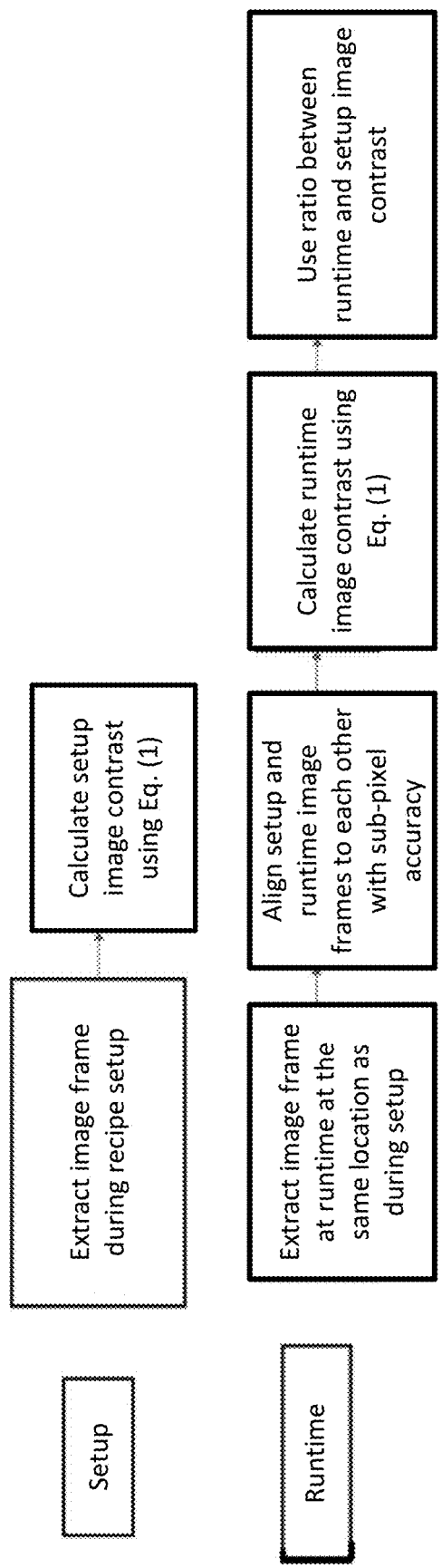
FIG. 2 is an exemplary comparison of contrast comparison between setup and runtime.

FIG. 1 is an embodiment of a method 100. An additional embodiment of the method 100 is shown in FIG. 2. Some or all of the steps of the method 100 can be performed using a processor.

In the method 100 of FIG. 1, a setup image frame is extracted at 101. This occurs during a recipe setup. For example, a golden image can be extracted from a selected die during setup. The golden image can be generated from a golden die. An image frame can be of, for example, a die on a semiconductor wafer or part of a die on a semiconductor wafer.

At 102, a first image contrast (C) is determined for the setup image frame. This can be determined for some or all pixels with a grey level intensity I using the following Eq. (1).

$$C = \frac{\Sigma_{x,y \in image} |\Delta I_{xy}|}{\Sigma_{x,y \in image} I_{xy}} \quad (1)$$

In Equation 1, $\Delta$ is a Laplacian operator. If there are known differences within a frame, then the first image contrast may only be determined for some of the pixels. Using only some pixels for the first image contrast may be performed for other reasons. If there are no known differences within a frame, then the first image contrast can be determined for all the pixels in the frame.

At 103, a runtime setup image frame is extracted. This occurs during runtime at a same location as the setup image frame. The setup image frame and the runtime image frame are aligned at 104. For example, a sum of squared differences can be determined while shifting the images against each other to determine a best alignment position. The setup image frame and runtime image frame may be of different dies or different wafers. If different dies or different wafers are used, then the same location is the same location on the wafer or the die as on the selected die used in the golden image.

At 105, a second image contrast is determined for the runtime image frame. This also can use Eq. (1).

At 106, a ratio between the first image contrast and the second image contrast is determined. If the ratio is close to 1.0, then the contrast has not changed significantly between setup and runtime. This can help during image alignment. Deviations farther from 1.0 can mean that corrective action should be taken. Out-of-control situations or focus variations can be reported based on the contrast ratio. Wafer-to-wafer or within-wafer image contrast variations can be monitored. For example, if the image contrast is blurry, then the inspection system or wafer can be out-of-control. These effects will be reflected in the ratio.

While the method 100 is described with one runtime image frame, more than one runtime image frame can be extracted. The second image contrast and resulting ratio can be determined for each of these runtime image frames. In an instance, this is repeated for every die or multiple dies during runtime.

Figure 5:
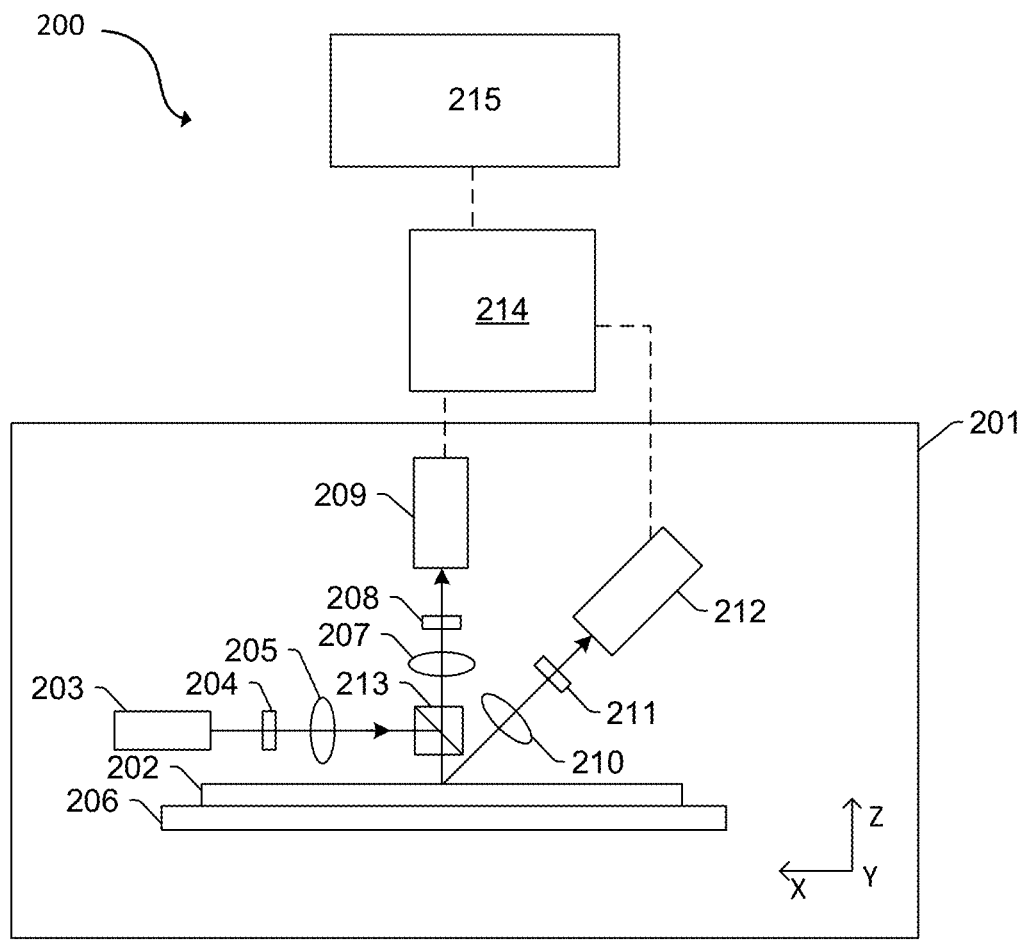
FIG. 5 is an embodiment of a system in accordance with the present disclosure.

In an instance, a position of a stage configured to hold a semiconductor wafer is adjusted based on the ratio. For example, the stage can be adjusted in the Z direction. A calibration curve can collect images through focus (e.g., with a known Z position) and calculate the image contrast for each focus. A curve can be fitted to these data points and used to predict the current Z position based on the image contrast (as shown in FIG. 5). This can improve focus and improve results of the ratio. The stage can be adjusted in the Z direction using a calibration curve.

In another instance, a contrast-based defect attribute is determined. Nuisance filtering or other troubleshooting can be performed using the contrast-based defect attribute. A contrast-based defect attribute can be, for example, the image contrast or a normalized image contrast.

In another instance, defect attribute values can be normalized using the contrast ratio. The contrast values for an image can include a wide range of numbers, so dividing the numbers by a maximum contrast value can be helpful.

In another instance, focus variations can be determined using the contrast ratio. This can use the calibration curve for the stage in the Z direction. Each image contrast value can be mapped to a certain focus. Focus variation can be determined based on this mapping.

In another instance, a candidate image and a reference image can be adjusted based on the contrast ratio. A candidate image can be the runtime image. The reference image can be the setup image or another golden image.

In yet another instance, a first offset between setup and runtime and a second offset between design and runtime can be determined for a plurality of inspection frames. For example, multiple frames on a setup wafer (e.g., a golden wafer) and a runtime wafer can be used. A placement of one or more care areas can be determined based on an offset correction that includes the first offset and the second offset. In an instance, the offsets are determined through the sum of a squared difference of the setup image and runtime image. If the setup and runtime images are both at the same focus, the x/y offset can be corrected with higher accuracy because the images look as similar as possible.

FIG. 2 shows another example. The image frame during recipe setup can be a golden die frame. The image frame size can be, for example, 196×196 pixels, but other sizes are possible.

Figure 3:
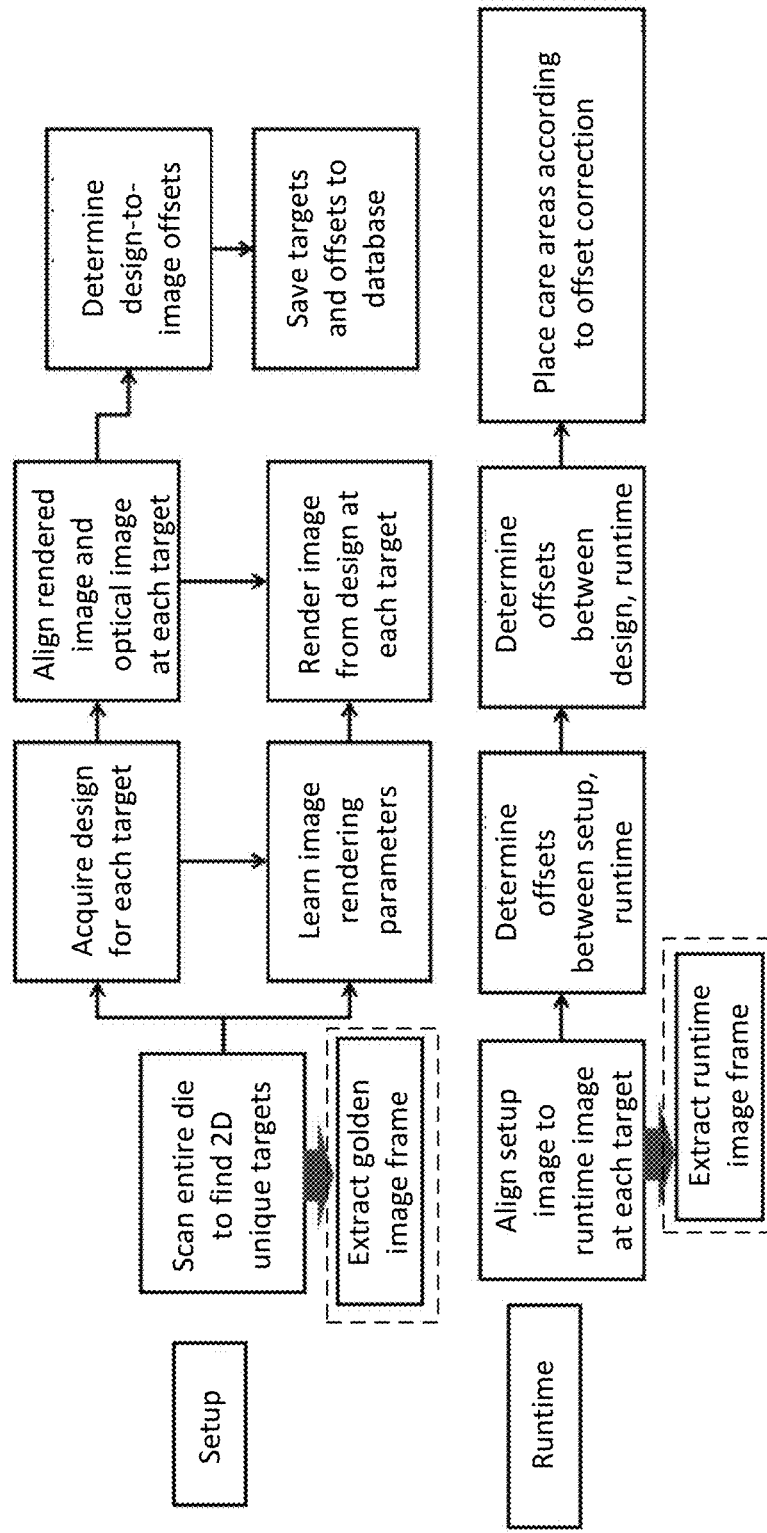
FIG. 3 is an exemplary flowchart of image data collection using patch-to-design alignment (PDA)

The image frame data during setup and during runtime may be collected while performing optical PDA. This image frame data during setup and runtime data can be used to collect the data which used for the image contrast comparison. The PDA flow is shown in FIG. 3. The highlighted items with a hashed outline show where image data can be extracted. The 2D unique targets may be evenly distributed across a die. Image rendering targets can be learned from example targets. Design-to-image offsets can be determined for each inspection frame from the targets. Saved targets and offsets in the database can be used for runtime inspection. Offsets between the setup and runtime images or the offsets between the design and runtime image can be determined for each inspection frame.

This data extraction in FIG. 3 may be added to a current process flow and can be used for the image contrast calculation. Note that FIG. 3 is merely one example of image data collection. Other techniques for collecting this data, such as using a completely independent flow, are possible.

Figure 4:
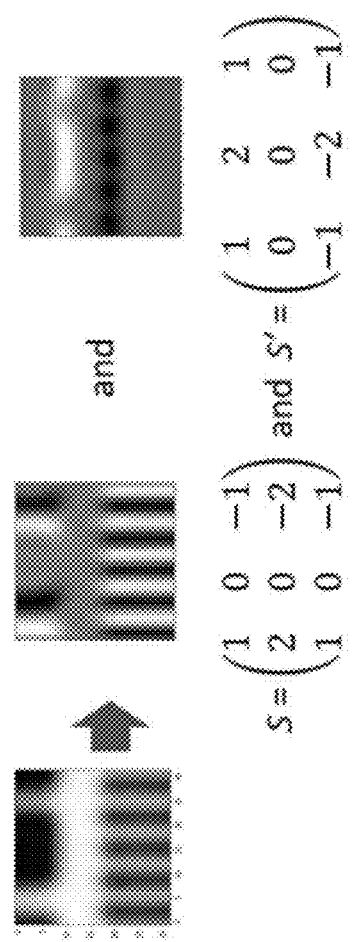
FIG. 4 illustrates determination of Tenengrad variance with exemplary image frames.

The contrast calculation is not limited to the Laplacian-based contrast, but could also be done using other metrics, such as the Tenengrad variance. FIG. 4 shows a calculation procedure with the Tenengrad variance. The Tenengrad variance (TEN) can convolve an image with Sobel operators and sum the square of all magnitudes greater than a threshold.

Using embodiments of the method 100, a semiconductor manufacturer can determine immediately if the focus of the inspection system is out-of-control and/or if adjustment is needed. This avoids manual calibration or an extra runtime focus calibration step, which affects throughput. Focus change can be directly measured based on the images being inspected and not on dummy structures. Stage position can be adjusted based on results. A lower variability of defect inspection results can be provided because the inspection system focus condition can be monitored in real time. Defect attribute values can vary less, which can lead to more stable inspection results and a higher capture rate of defects. Tool-to-tool matching (i.e., between inspection systems) can be improved. More stable results can be provided for applications that use images or defect attributes, such as a decision tree (e.g., a random forest-based decision tree) or other nuisance event filters.

One embodiment of a system 200 is shown in FIG. 5. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen 202 includes a reticle. The reticle may include any reticle known in the art.

In the embodiment of the system 200 shown in FIG. 5, optical based subsystem 201 includes an illumination subsystem configured to direct light to specimen 202. The illumination subsystem includes at least one light source. For example, as shown in FIG. 5, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 5, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 5. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 5 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 5) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 5 as a single refractive optical element, it is to be understood that, in practice, lens 205 may include a number of refractive and/or reflective optical elements that in combination focus the light from the optical element to the specimen. The illumination subsystem shown in FIG. 5 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 5 includes two detection channels, one formed by collector 207, element 208, and detector 209 and another formed by collector 210, element 211, and detector 212. As shown in FIG. 5, the two detection channels are configured to collect and detect light at different angles of collection. In some instances, both detection channels are configured to detect scattered light, and the detection channels are configured to detect light that is scattered at different angles from the specimen 202. However, one or more of the detection channels may be configured to detect another type of light from the specimen 202 (e.g., reflected light).

As further shown in FIG. 5, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 5 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 5 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 5 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane.

As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 5 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with a scanning electron microscope.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to perform embodiments of the method 100. The processor 214 can extract a setup image frame during a recipe setup and determine a first image contrast for the setup image frame. The processor 214 also can extract a runtime setup image frame during runtime at a same location as the setup image frame, align the setup image frame and the runtime image frame, and determine a second image contrast for the runtime image frame. The processor 214 then can determine a ratio between the first image contrast and the second image contrast.

While disclosed as using the same system 200, the setup image frame can be extracted by a different system than the runtime setup image frame.

An additional embodiment relates to a non-transitory computer-readable medium storing program instructions executable on a controller for performing a computer-implemented method for classifying a wafer map, as disclosed herein. In particular, as shown in FIG. 5, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

While the system 200 uses light, the method 100 can be performed using a different semiconductor inspection system. For example, the method 100 can be performed using results from a system that uses an electron beam, such as a scanning electron microscope, or an ion beam. Thus, the system can have an electron beam source or an ion beam source as the energy source instead of a light source.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
   extracting, using a processor, a setup image frame during a setup;
   determining, using the processor, a first image contrast for the setup image frame;
   extracting a runtime setup image frame, using the processor, during runtime at a same location as the setup image frame;
   aligning, using the processor, the setup image frame and the runtime image frame;
   determining, using the processor, a second image contrast for the runtime image frame; and
   determining, using the processor, a ratio between the first image contrast and the second image contrast,
   wherein the first image contrast and the second image contrast are determined using the formula $$\frac{\sum_{x,y \in image} |\Delta I_{xy}|}{\sum_{x,y \in image} I_{xy}},$$

where I is a grey level intensity and A is a Laplacian operator.

2. The method of claim 1, further comprising adjusting a position of a stage configured to hold a semiconductor wafer based on the ratio.

3. The method of claim 1, further comprising normalizing the ratio by dividing the first image contrast by a maximum contrast for the setup image frame and dividing the second image contrast by a maximum contrast in the runtime image frame using the processor.

4. The method of claim 1, further comprising determining, using the processor, focus variations caused by a position of a stage configured to hold a semiconductor wafer using the contrast ratio.

5. The method of claim 1, further comprising adjusting, using the processor, the runtime image frame and the setup image frame based on the contrast ratio.

6. The method of claim 1, further comprising:
   determining, using the processor, a first offset between setup and runtime for a plurality of inspection frames;
   determining, using the processor, a second offset between design and runtime for the plurality of inspection frames; and
   determining, using the processor, a placement of one or more care areas for inspection based on an offset correction that includes the first offset and the second offset.

7. The method of claim 1, further comprising determining, using the processor, offsets using a sum of a squared difference of the setup image frame and runtime image frame.

8. A non-transitory computer readable medium storing a program configured to instruct a processor to execute the method of claim 1.

9. A system comprising:
   a stage configured to hold a semiconductor wafer;
   a light source configured to direct a beam of light at the semiconductor wafer on the stage;
   a detector configured to receive the beam of light reflected from the semiconductor wafer on the stage; and
   a processor in electronic communication with the detector, wherein the processor is configured to:
   extract a setup image frame during a recipe setup;
   determine a first image contrast for the setup image frame;
   extract a runtime setup image frame during runtime at a same location as the setup image frame;
   align the setup image frame and the runtime image frame;
   determine a second image contrast for the runtime image frame; and
   determine a ratio between the first image contrast and the second image contrast,
   wherein the first image contrast and the second image contrast are determined using the formula $$\frac{\sum_{x,y \in image} |\Delta I_{xy}|}{\sum_{x,y \in image} I_{xy}},$$

where I is a grey level intensity and A is a Laplacian operator.

10. The system of claim 9, wherein the processor is further configured to adjust a position of the stage based on the ratio.

11. The system of claim 9, wherein the processor is further configured to normalize the ratio by dividing the first image contrast by a maximum contrast for the setup image frame and dividing the second image contrast by a maximum contrast in the runtime image frame.

12. The system of claim 9, wherein the processor is further configured to determine focus variations caused by a position of the stage using the contrast ratio.

13. The system of claim 9, wherein the processor is further configured to adjust the runtime image frame and the setup image frame based on the contrast ratio.

14. The system of claim 9, wherein the processor is further configured to:
   determine a first offset between setup and runtime for a plurality of inspection frames;
   determine a second offset between design and runtime for the plurality of inspection frames; and
   determine a placement of one or more areas for inspection based on an offset correction that includes the first offset and the second offset.

15. The system of claim 9, wherein the processor is further configured to determine offsets using a sum of a squared difference of the setup image frame and runtime image frame.

* * * * *